(12) United States Patent
Tada (10) Patent No.: US 7,450,046 B2
(45) Date of Patent: Nov. 11, 2008

(54) DELTA-SIGMA MODULATOR AND A/D CONVERTER

(75) Inventor: Yusaku Tada, Kanagawa (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 11/689,530

(22) Filed: Mar. 22, 2007

(65) Prior Publication Data
US 2007/0247340 A1 Oct. 25, 2007

(30) Foreign Application Priority Data
Apr. 24, 2006 (JP) ............... 2006-119679

(51) Int. Cl.
H03M 3/00 (2006.01)
(52) U.S. Cl. ..................... 341/143; 341/144
(58) Field of Classification Search ............ 341/143, 341/155, 172, 139, 152
See application file for complete search history.

(56) References Cited

U.S. PATENT DOCUMENTS

| | | | | |
|---|---|---|---|---|
| 4,888,587 A | * | 12/1989 | Kuraishi | 341/122 |
| 5,159,341 A | * | 10/1992 | McCartney et al. | 341/143 |
| 5,703,589 A | * | 12/1997 | Kalthoff et al. | 341/172 |
| 6,970,126 B1 | * | 11/2005 | O'Dowd et al. | 341/172 |

FOREIGN PATENT DOCUMENTS

JP 7-249989 9/1995

OTHER PUBLICATIONS

English Language Abstract of JP 7-249989.

* cited by examiner

*Primary Examiner*—Brian Young
(74) *Attorney, Agent, or Firm*—Greenblum & Bernstein, P.L.C.

(57) ABSTRACT

A delta-sigma modulator and A/D converter capable of doubling an oversampling ratio without increasing an operating speed of the circuit at an A/D modulator provided with a delta-sigma modulator which carries out differentiation and integration processing on two channels of analog input. A delta-sigma modulator is configured with a first sampling section that samples a first analog input, a second sampling section that samples a second analog input, a third sampling section that samples an output of a quantizer corresponding to the first analog input, a fourth sampling section that samples the output of the quantizer corresponding to the second analog input, and a switch control circuit that controls analog switches so as to carry out time division processing on integration of the output of the first sampling section and the output of the third sampling section and integration of the output of the second sampling section and the output of the fourth sampling section.

10 Claims, 5 Drawing Sheets

DELTA-SIGMA MODULATOR AND A/D CONVERTER

CROSS REFERENCE TO RELATED APPLICATIONS

The disclosure of Japanese Patent Application No. 2006-119679 filed on Apr. 24, 2006 including the specification, drawings and abstract is incorporated herein by reference in its entirety.

BACKGROUND OF THE INVENTION

1. Field of the Invention

The present invention relates to a delta-sigma modulator and an A/D converter provided with a delta-sigma modulator, and, for example, relates to a delta-sigma modulator and an A/D converter provided with a delta-sigma modulator used in a recording apparatus for two channel analog signals (Lch/Rch).

2. Description of Related Art

In the related art, an equipment provided with a delta-sigma modulator which performs differentiation and integration processing on analog input and transmits digital output with a small number of bits such as one bit is well known as an A/D converter. Normally, the digital output of a small number of bits from the delta-sigma modulator is converted to digital output of a large number of bits using a decimation circuit such as a digital filter.

Figure 1:
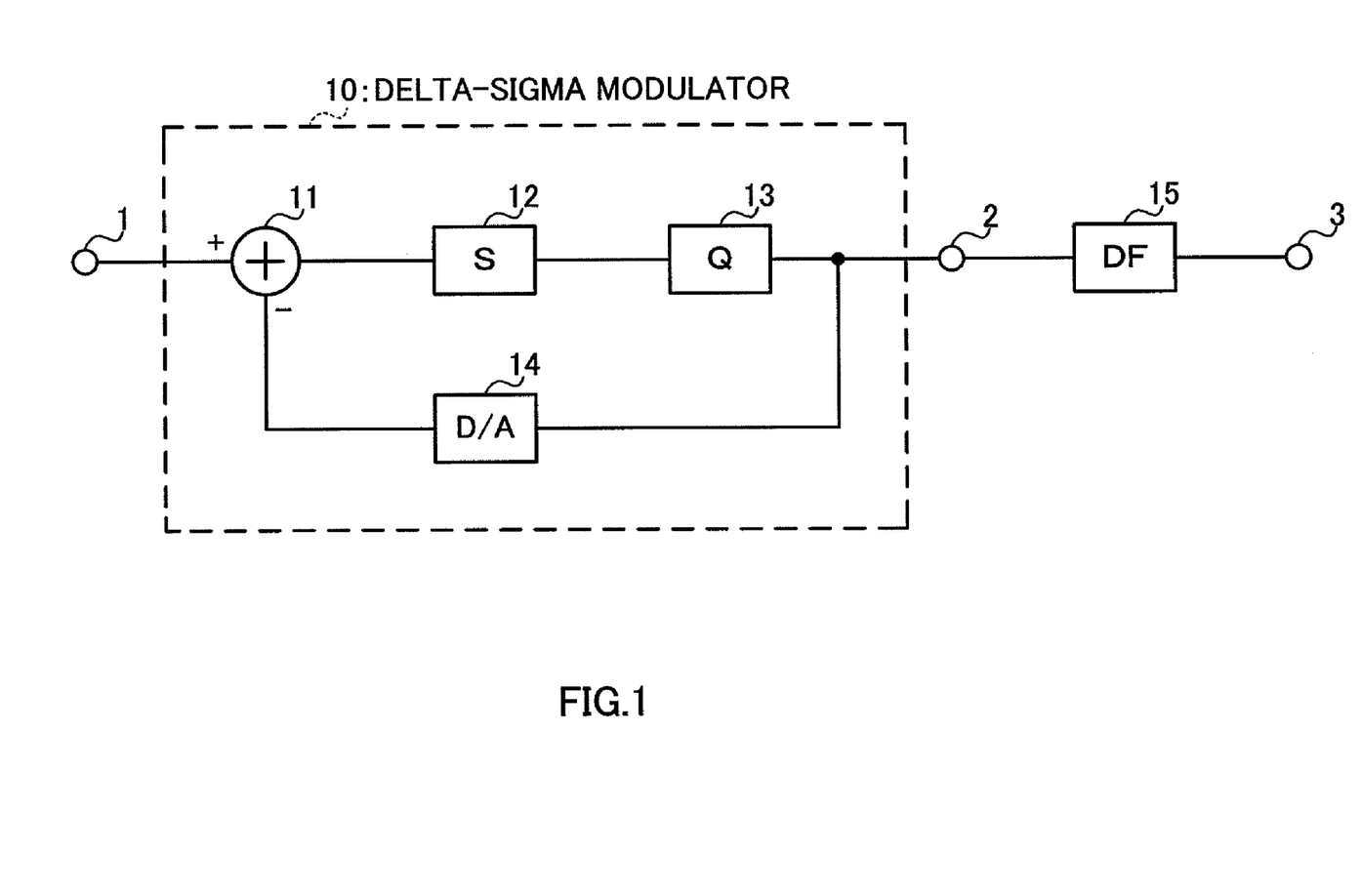
FIG. 1 is an operation principle diagram of an A/D converter provided with a delta-sigma modulator of the related art.

FIG. 1 illustrates the principle of operation of an A/D converter provided with a delta-sigma modulator.

As shown in FIG. 1, from an analog input signal applied to input terminal 1, a reference analog voltage which is output of one bit of D/A converter 14 is subtracted by adder 11, and this differential signal is integrated by integrator 12. This integrated signal is then quantized to a digital signal by quantizer 13. This quantized signal is inputted to D/A converter 14, and inputted to adder 11 as a reference analog voltage. A circuit configured with adder 11, integrator 12, quantizer 13 and D/A converter 14 is referred to as delta-sigma modulator 10, and the output of quantizer 13 is transmitted to delta-sigma modulator output terminal 2. The output of delta-sigma modulator 10 is decimated by digital filter 15, and an N-bit digital signal is transmitted to A/D converter output terminal 3.

Next, the detailed operation of an A/D converter provided with a delta-sigma modulator will be described.

Figure 2:
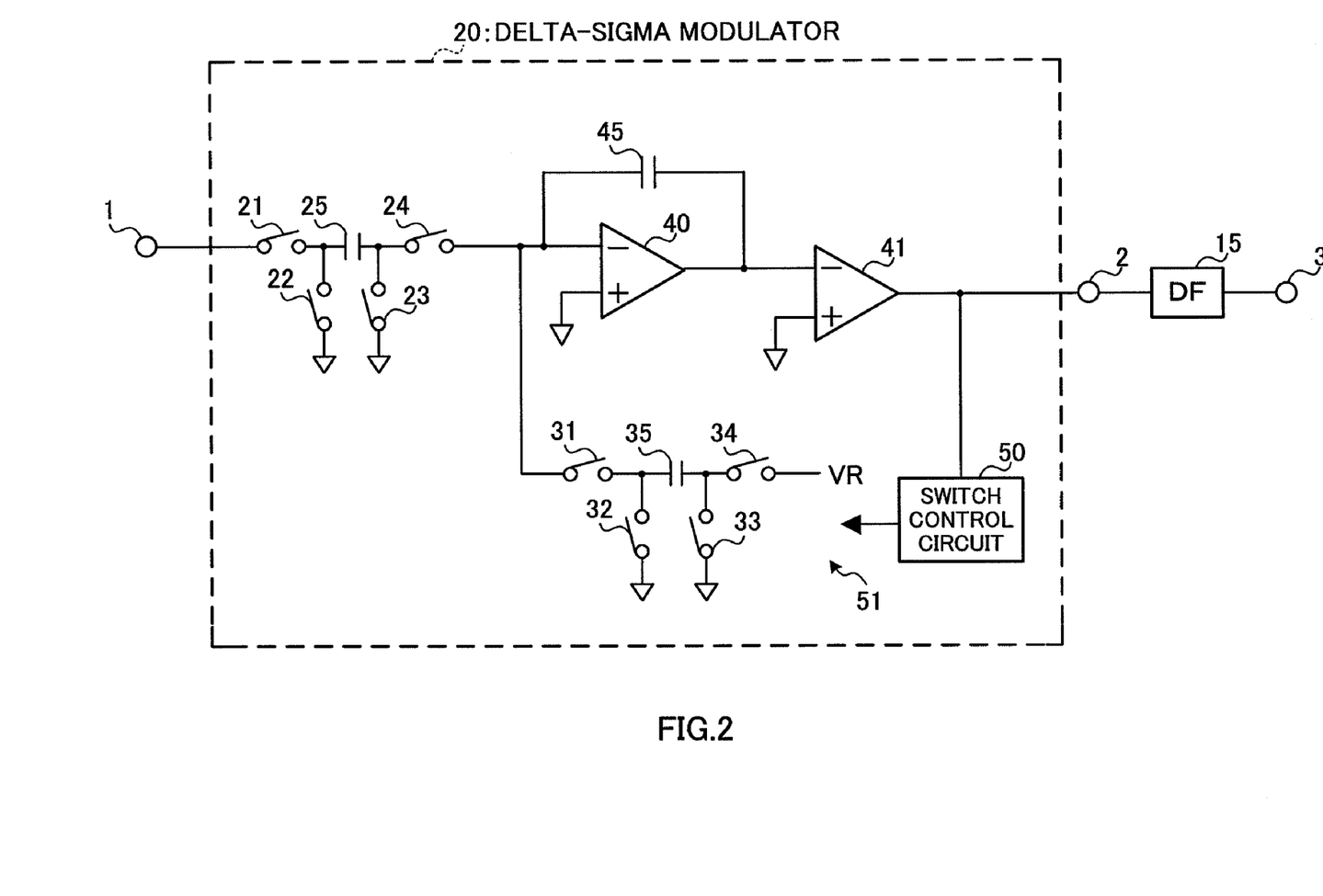
FIG. 2 is a circuit configuration diagram of the A/D converter provided with the delta-sigma modulator of the related art.

FIG. 2 is a circuit diagram showing a specific configuration of the A/D converter provided with the delta-sigma modulator. Components that are the same as those in FIG. 1 will be assigned the same reference numerals.

In FIG. 2, 1 is an input terminal, 2 is a delta-sigma modulator output terminal, 3 is an A/D converter output terminal, 21 to 24 and 31 to 34 are analog switches, 25, 35 and 45 are capacitor elements, 40 is an operational amplifier, and 41 is a quantizer. The output of quantizer 41 is decimated by digital filter 15 and inputted to switch control circuit 50. Switch control circuit 50 controls analog switches 21 to 24 and 31 to 34, and this path configures D/A converter 51 for charging reference voltage VR. Operational amplifier 40 and capacitor element 45 configure an integrator, and charge of the charged capacitor is integrated by capacitor element 45.

The above-described analog switches 21 to 24 and 31 to 34, capacitor elements 25, 35 and 45, operational amplifier 40, quantizer 41 and switch control circuit 50 configure delta-sigma modulator 20.

When this delta-sigma modulator 20 reaches a state of equilibrium, the input signal is charged to capacitor element 25, while a sampling period of charging reference voltage VR according to the output of quantizer 41 to capacitor element 35 and an integration period of charging charge of capacitor elements 25 and 35 to capacitor element 45 are repeated.

During the sampling period, switches 21 and 23 are turned on, switches 22 and 24 are turned off, and input voltage Vin is charged to capacitor element 25, while switches 31 to 34 are controlled via switch control circuit 50 so that the output result of quantizer 41 is D/A converted to capacitor element 35.

During the integration period, switches 21 and 23 are turned off, switches 22 and 24 are turned on, and switches 31 to 34 are controlled via switch control circuit 50 so that capacitor element 45 is charged with addition of the charge of capacitor element 25 and capacitor element 35.

By operating the above-described delta sigma modulator 20 at an extremely high frequency compared to the input signal frequency, quantization noise generated by quantizer 41 is focused on high-frequency band compared to the input signal frequency band. At this time, the quantization noise is distributed in the higher-frequency band when the ratio between the operating frequency (sampling frequency) of the circuit and the input signal frequency—the oversampling ratio—is higher, so that a high S/N can be obtained as an A/D converter.

However, with the above-described technique, only one channel of input signal can be processed with one delta-sigma modulator, and it is therefore necessary to provide delta-sigma modulators in parallel according to the number of channels in order to process input signals of a plurality of channels. When the AID converter provided with a delta-sigma modulator is subjected to LSI (Large Scale Integration), the dimension of the delta-sigma modulator on the semiconductor chip is large compared to other circuit elements. As a result, when the number of delta-sigma modulators increases according to increase in the number of channels, there is a problem that the chip size increases substantially in proportion to the number of channels, and the equipment becomes large.

As the related art which resolves the above-described problem, patent document 1 (Japanese Patent Application Laid-Open No. HEI. 7-249989) discloses an A/D converter provided with the delta-sigma modulator described above. The delta-sigma modulator of patent document 1 is a delta-sigma modulator having: a switching section that sequentially and selectively switches analog input of a plurality of channels and transmits the result as a time-divided input; a plurality of capacitors corresponding to the plurality of channels, that are sigma-delta modulators that perform differentiation and integration processing on the time-divided input from the switching section and transmit the time-divided digital output; and a section that carries out integration by switching to a capacitor for integration corresponding to each channel, and transmits the time-divided digital output.

Figure 3:
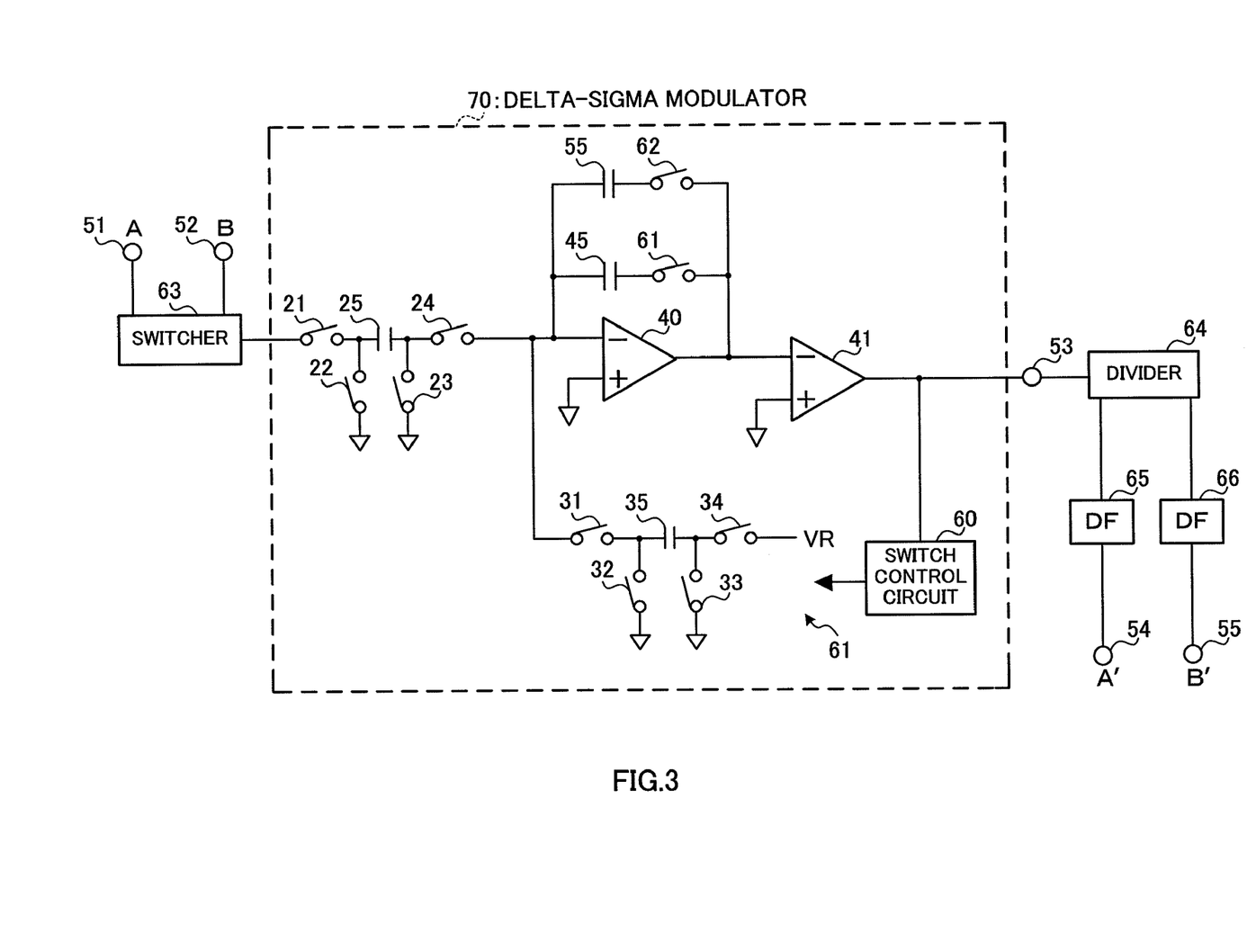
FIG. 3 is a specific circuit configuration diagram of the A/D converter provided with the delta-sigma modulator of the related art.

FIG. 3 is a circuit diagram showing a specific configuration of the A/D converter provided with the delta-sigma modulator disclosed in patent document 1. Components that are the same as those in FIG. 2 will be assigned the same reference numerals.

In FIG. 3, 51 and 52 are input terminals, 53 is a delta-sigma modulator output terminal, 54 and 55 are A/D converter output terminals, 21 to 24, 31 to 34, 61 and 62 are analog switches, 25, 35, 45 and 55 are capacitor elements, 40 is an operational amplifier, 41 is a quantizer, 63 is a switcher, 64 is a divider, and 65 and 66 are digital filters.

Switcher 63 alternately digital-division inputs input signals A and B, and the output of quantizer 41 is transmitted to delta-sigma modulator output terminal 53 according to this. Divider 64 alternately transmits the output of quantizer 41 to digital filters 65 and 66 according to the input signal. The output of quantizer 41 controls analog switches 21 to 24 and 31 to 34, 61 and 62 via switch control circuit 60, and this path configures D/A converter 61 that charges reference voltage VR. Operational amplifier 40 and capacitor element 45, or capacitor element 55 configure an integrator, and the charge of the charged capacitor is integrated by capacitor element 45 and capacitor element 55.

The above-described analog switches 21 to 24 and 31 to 34, 61 and 62, capacitor elements 25, 35, 45 and 55, operational amplifier 40, quantizer 41, and switch control circuit 60 configure delta-sigma modulator 70.

When this delta-sigma modulator 70 reaches a state of equilibrium, input signal A is charged to capacitor element 25, while a sampling period of sampling input signal A which is charged to capacitor element 35 with reference voltage VR according to the output of quantizer 41 and an integration period of integrating input signal A which is charged to capacitor element 45 with charge of capacitor elements 25 and 35 are sequentially repeated. At the same time, input signal B is charged to capacitor element 25, while a sampling period of sampling input signal B which is charged to capacitor element 35 with reference voltage VR according to the output of quantizer 41 and an integration period of integrating input signal B which is charged to capacitor element 55 with charge of capacitor elements 25 and 35 are sequentially repeated.

During the sampling period of input signal A, input signal A is selected by switcher 63, switches 21 and 23 are turned on, switches 22 and 24 are turned off, and, capacitor element 25 is charged with Vin a of input voltage A, while switches 31 to 34 are controlled via switch control circuit 60 so that the output result of quantizer 41 is D/A converted to capacitor element 35. Further, the output of quantizer 41 is transmitted to digital filter 65 via divider 64.

During the integration period of input signal A, switches 21, 23 and 62 are turned off, switches 22, 24 and 61 are turned on, and switches 31 to 34 are controlled via switch control circuit 60 so that capacitor element 45 is charged with addition of the charge of capacitor element 25 and capacitor element 35.

During the sampling period of input signal B, input signal B is selected by switcher 63, switches 21 and 23 are turned on, switches 22 and 24 are turned off, and capacitor element 25 is charged with Vin b of input voltage B, while switches 31 to 34 are controlled via switch control circuit 60 so that the output result of quantizer 41 is D/A converted to capacitor element 35. Further, the output of quantizer 41 is transmitted to digital filter 66 via divider 64.

During the integration period of input signal B, switches 21, 23 and 61 are turned off, switches 22, 24 and 62 are turned on, and switches 31 to 34 are controlled via switch control circuit 60 so that capacitor element 55 is charged with addition of the charge of capacitor element 25 and capacitor element 35.

However, with such an AID converter provided with the delta-sigma modulator of the related art, the analog input of two channels is supplied to the delta-sigma modulator by a time-division input switching section. Therefore, the oversampling ratio is ½ times compared to a delta-sigma modulator which processes analog input of one channel using one delta-sigma modulator, and S/N (resolution) deteriorates.

The resolution of the delta-sigma modulator depends on the oversampling ratio. For example, with a second order delta-sigma modulator, by doubling the oversampling ratio, resolution is improved by 2.5 bits, and, with a third order modulator, by doubling the oversampling ratio, resolution is improved by 3.5 bits. As a result, it is preferable to operate at an oversampling ratio as high as possible. However, when the oversampling ratio is made high, the operating speed of the circuit also increases in proportion to the oversampling ratio, and therefore the current consumption also increases.

That is, in the related art, when the oversampling ratio is made one time compared to the delta-sigma modulator which processes analog input of one channel using one delta-sigma modulator, the operating speed of the circuit is doubled, and there is a problem that current consumption increases.

SUMMARY OF THE INVENTION

It is therefore an object of the present invention to provide a delta-sigma modulator and A/D converter capable of doubling the oversampling ratio without increasing the operating speed of the circuit at an A/D converter provided with a delta-sigma modulator which performs differentiation and integration processing on the analog input of two channels.

According to an aspect of the invention, a delta-sigma modulator has: a first sampling section that samples first analog input; a second sampling section that samples second analog input; a third sampling section that samples output of a quantizer corresponding to the first analog input; a fourth sampling section that samples output of the quantizer corresponding to the second analog input; and a control section that carries out time division processing on integration of an output of the first sampling section and an output of the third sampling section and integration of an output of the second sampling section and integration of an output of the fourth sampling section.

According to another aspect of the invention, an A/D converter has the delta-sigma modulator according to the above aspect; a divider that divides output of the delta-sigma modulator so as to correspond to the input; and a digital filter that decimates the divided output of the delta-sigma modulator.

DETAILED DESCRIPTION OF THE PREFERRED EMBODIMENT

Embodiment of the present invention will be described in detail below with reference to the accompanying drawings.

Figure 4:
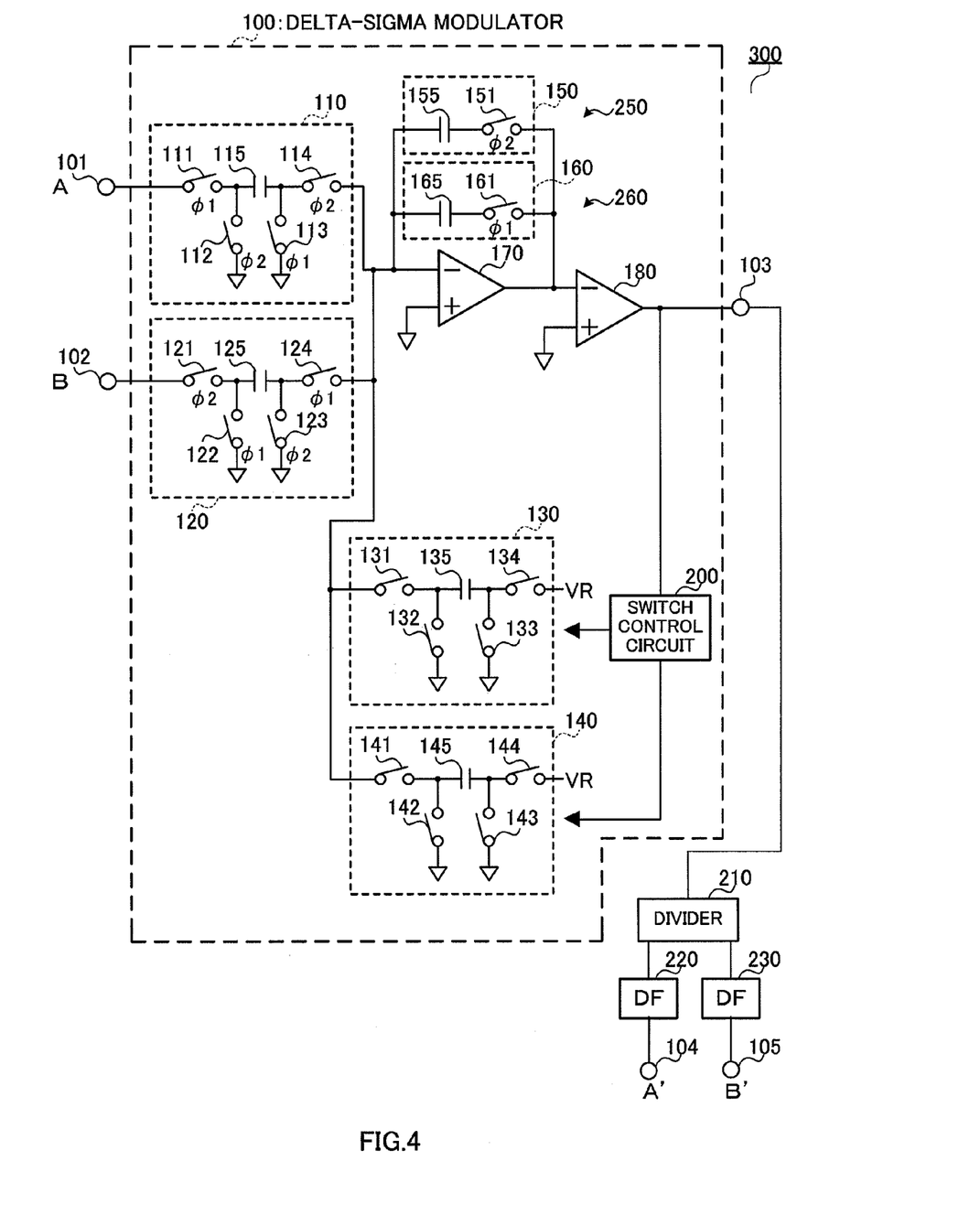
FIG. 4 is a circuit configuration diagram of an A/D converter provided with a delta-sigma modulator according to an embodiment of the present invention.

FIG. 4 is a circuit diagram showing the configuration of a delta-sigma modulator according to an embodiment of the present invention. This embodiment is an example which applies an A/D converter provided with a delta-sigma modulator which carries out differentiation and integration processing on analog input of two channels.

In FIG. 4, 101 and 102 are input terminals, 103 is a delta-sigma modulator output terminal, 104 and 105 are A/D converter output terminals, 111 to 114, 121 to 124, 131 to 134, 141 to 144, 151 and 161 are analog switches, 115, 125, 135, 145, 155 and 165 are capacitor elements, 170 is an operational amplifier, 180 is a quantizer, 200 is a switch control circuit, 210 is a divider, and 220 and 230 are digital filters corresponding to analog input of two channels.

The above-described analog switches 111 to 114, 121 to 124, 131 to 134, 141 to 144, 151 and 161, capacitor elements 115, 125, 135, 145, 155 and 165, operational amplifier 170, quantizer 180, and switch control circuit 200 configure delta-sigma modulator 100, and delta-sigma modulator 100, divider 210 and digital filters 220 and 230 configure A/D converter 300.

Divider 210 transmits the output of delta-sigma modulator 100 corresponding to the analog input of two channels to digital filters 220 and 230. The output of digital filters 220 and 230 is outputted to outside from A/D converter output terminals 104 and 105 as the output of A/D converter 300.

Delta-sigma modulator 100 is configured with: first sampling section 110 that is configured with analog switches 111 to 114 and capacitor element 115 and samples analog input A (first analog input); second sampling section 120 that is configured with analog switches 121 to 124 and capacitor element 125 and samples analog input B (second analog input); third sampling section 130 that is configured with analog switches 131 to 134 and capacitor element 135 and samples output of quantizer 180 corresponding to analog input A; fourth sampling section 140 that is configured with analog switches 141 to 144 and capacitor element 145 and samples the output of quantizer 180 corresponding to analog input B; first integration section 250 that is configured with first feedback circuit 150 which is configured with analog switch 151 and capacitor element 155, and operational amplifier 170 and integrates output of first sampling section 110 and third sampling section 130; second integration section 260 that is configured with second feedback circuit 160 which is configured with analog switch 161 and capacitor element 165, and operational amplifier 170 and integrates output of second sampling section 120 and fourth sampling section 140. Here, switch control circuit 200 controls analog switches 111 to 114, 121 to 124, 131 to 134, 141 to 144, 151 and 161 to be on and off so as to perform time-division processing on integration of the output of first sampling section 110 and the output of third sampling section 130 by first integration section 250, and integration of the output of second sampling section 120 and the output of fourth sampling section 140 by second integration section 260.

Switch control circuit 200 carries out switch control to integrate the output of second sampling section 120 and the output of fourth sampling section 140 upon sampling of the first analog input by first sampling section 110 and sampling the output of quantizer 180 corresponding to the first analog input, and integrate the output of first sampling section 110 and the output of third sampling section 130 upon sampling of the second analog input by second sampling section 120 and sampling of the output of quantizer 180 corresponding to the second analog input.

In particular, switch control circuit 200 carries out switch control to integrate the already sampled second analog input and the output of quantizer 180 corresponding to the already sampled second analog input upon sampling of the first analog input and sampling of the output of quantizer 180 corresponding to the first analog input, and integrate the already sampled first analog input and the output of quantizer 180 corresponding to the already sampled first analog input upon sampling of the second analog input and sampling of the output of quantizer 180 corresponding to the second analog input.

Quantizer 180 is, for example, an N-bit A/D converter. Further, third and fourth sampling sections 130 and 140 which sample the output of quantizer 180 are N-bit D/A converters.

The operation of a delta-sigma modulator configured as described above will be described.

Figure 5:
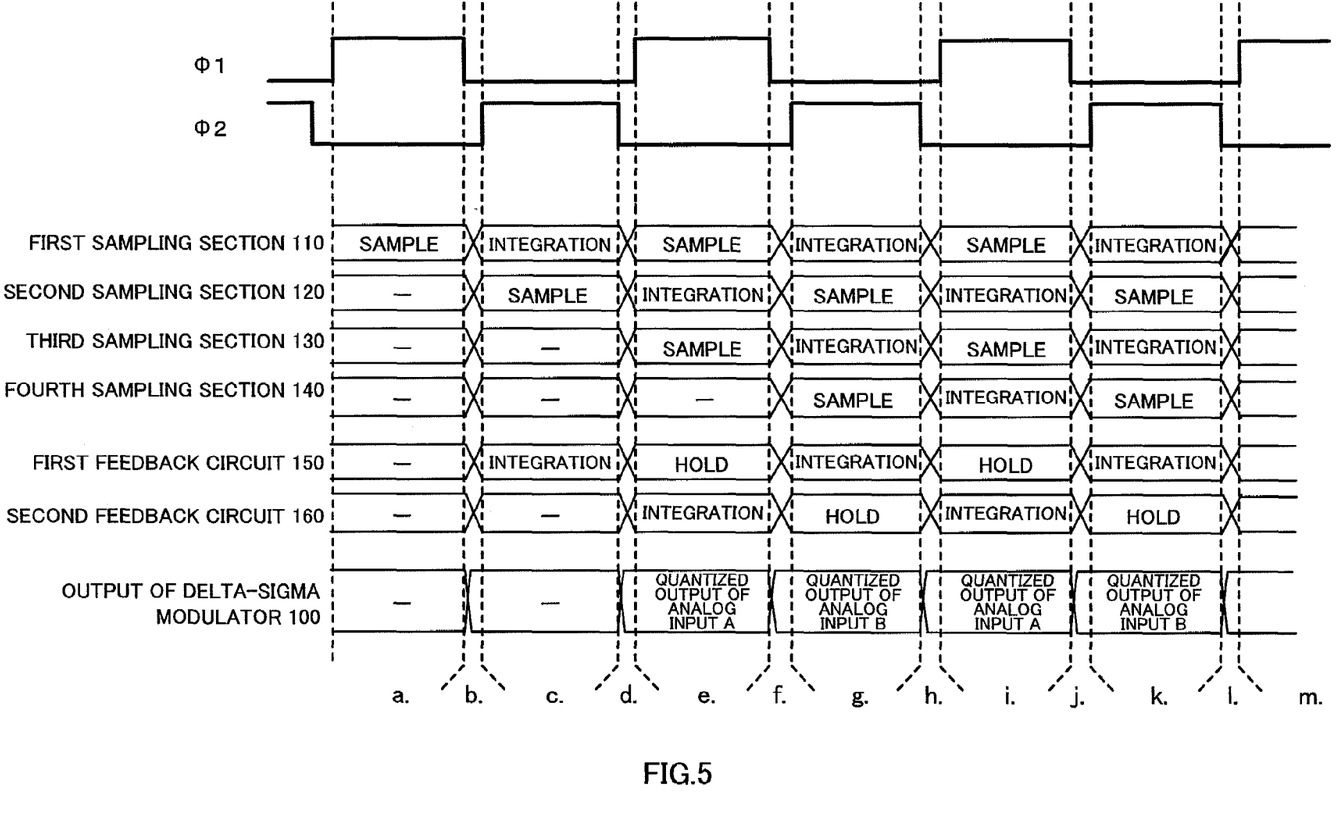
FIG. 5 is a timing chart diagram of analog switch control signals φ1 and φ2 of a switch control circuit for a delta-sigma modulator according to this embodiment.

FIG. 5 is a timing chart diagram of analog switch control signals φ1 and φ2 of switch control circuit 200 of delta-sigma modulator 100.

Switch control circuit 200 outputs analog switch control signals φ1 and φ2 to analog switches 111 to 114, 121 to 124, 131 to 134, 141 to 144, 151 and 161, and controls on and off of these analog switches at timings shown in FIG. 5. Analog switch control signals φ1 and φ2 make each analog switch conductive or non-conductive according to H or L level.

At first sampling section 110, analog switch 111, capacitor element 115 and analog switch 114 are connected in series, analog switch 112 is connected between one end of capacitor element 115 and a ground point, and analog switch 113 is connected between one end of capacitor element 115 and a ground point.

At second sampling section 120, analog switch 121, capacitor element 125 and analog switch 124 are connected in series, analog switch 122 is connected between one end of capacitor element 125 and a ground point, and analog switch 123 is connected between one end of capacitor element 125 and a ground point.

At third sampling section 130, analog switch 131, capacitor element 135 and analog switch 134 are connected in series, analog switch 132 is connected between one end of capacitor element 135 and a ground point, and analog switch 133 is connected between one end of capacitor element 135 and a ground point.

At fourth sampling section 140, analog switch 141, capacitor element 145 and analog switch 144 are connected in series, analog switch 142 is connected between one end of capacitor element 145 and a ground point, and analog switch 143 is connected between one end of capacitor element 145 and a ground point.

For example, at first sampling section 110 of analog input A, when analog switch control signal φ1 is at H level and analog switch control signal φ2 is at L level, analog switch 111 and analog switch 113 become conductive, analog switch 114 and analog switch 112 become non-conductive, and capacitor element 115 is charged with charge of analog input A. After this, when analog switch control signal φ1 is at L level and analog switch control signal φ2 is at L level, analog switch 111 and analog switch 113 become non-conductive, analog switch 114 and analog switch 112 become non-conductive, and capacitor element 115 holds the charge of analog input A. Further, when analog switch control signal φ1 is at L level and analog switch control signal φ2 is at H level, analog switch 111 and analog switch 113 become non-conductive, analog switch 114 and analog switch 112 become non-conductive, and capacitor element 115 integrates the held charge of analog input A.

First integration section 250 and second integration section 260 will be described. At first and second integration sections 250 and 260, an inverting input terminal and a non-inverting input terminal of operational amplifier 170 are connected to an addition point and a ground point respectively, and first feedback circuit 150 and second feedback circuit 160 are connected in parallel between the addition point and an output terminal of operational amplifier 170. At first feedback circuit 150, capacitor element 155 and analog switch 151 are connected in series. At second feedback circuit 160, capacitor element 165 and analog switch 161 are connected in series.

For example, at first integration section 250, when analog switch control signal φ1 is at L level and analog switch control signal φ2 is at H level, analog switch 151 becomes conductive and analog switch 161 becomes non-conductive, and charge of first sampling section 110 and charge of third sampling section 130 are integrated to capacitor element 155. After this, at first integration section 250, when analog switch control signal φ1 is at L level and analog switch control signal φ2 is at L level, analog switch 151 becomes non-conductive and analog switch 161 becomes non-conductive, and charge is held at capacitor element 155. Further, at second integration section 260, when analog switch control signal φ1 is at H level and analog switch control signal φ2 is at L level, analog switch 161 becomes conductive and analog switch 151 becomes non-conductive, and charge of second sampling section 120 and charge of fourth sampling section 140 are integrated to capacitor element 165. After this, at second integration section 260, when analog switch control signal φ1 is at L level and analog switch control signal φ2 is at L level, analog switch 161 becomes non-conductive and analog switch 161 becomes non-conductive, and charge is held at capacitor element 165.

Quantizer 180 is a one-bit quantizer (comparator) and determines whether the output of first and second integration sections 250 and 260 is positive or negative. Quantizer 180 is an N-bit A/D converter, and may convert the output of first and second integration sections 250 and 260 to an N-bit digital signal to output.

Switch control circuit 200 controls analog switches 131 to 134 so that the output result of quantizer 180 corresponding to analog input A is D/A converted to capacitor element 135 of third sampling section 130. Switch control circuit 200 controls analog switches 141 to 144 so that the output result of quantizer 180 corresponding to analog input B is D/A converted to capacitor element 145 of fourth sampling section 140. Here, it is also possible to configure switch control circuit 200 with an N-bit D/A converter, D/A convert the output result of the A/D converter corresponding to analog input A to capacitor element 135, and D/A convert the output result of the N-bit A/D converter corresponding to analog input B to capacitor element 145.

Divider 210 transmits the output result of quantizer 180 corresponding to analog input A to digital filter 220, and transmits the output result of quantizer 180 corresponding to analog input B to digital filter 230.

The operation of delta-sigma modulator 100 will be described in detail with reference to the timing chart of FIG. 5.

First, capacitor element 115 of first sampling section 110 is charged with the charge of analog input A according to analog switch control φ1 being at H level and analog switch control φ2 being at L level (operating state: a.).

Next, capacitor element 115 of first sampling section 110 holds the charge of analog input A according to analog switch control φ1 being at L level and analog switch control φ2 being at L level (operating state: b.).

Next, charge of capacitor element 115 of first sampling section 110 is integrated to capacitor element 155 of first feedback circuit 150 according to analog switch control φ1 being at L level and analog switch control φ2 being at H level, and quantizer 180 converts the output of first and second integration sections 250 and 260 to a digital signal. Further, capacitor element 125 of second sampling section 120 is charged with the charge of analog input B (operating state: c.).

Next, according to analog switch control φ1 being at L level and analog switch control φ2 being at L level, capacitor element 155 of first feedback circuit 140 holds the integrated charge, switch control circuit 200 controls analog switches 131 to 134 so that the output result of quantizer 180 is charged to capacitor element 135 of third sampling section 130, and divider 210 transmits the output of quantizer 180 to digital filter 220. Further, capacitor element 125 of second sampling section 120 holds charge of analog input B (operating state: d.).

Next, according to analog switch control φ1 being at H level and analog switch control φ2 being at L level, capacitor element 115 of first sampling section 110 is charged with the charge of analog input A, and capacitor element 135 of third sampling section 130 is charged with the charge according to the output result of quantizer 180. Further, charge of capacitor element 125 of second sampling section 120 is integrated to capacitor element 165 of second feedback circuit 160, and quantizer 180 converts the output of first and second integration sections 250 and 260 to a digital signal (operating state: e).

Next, according to analog switch control φ1 being at L level and analog switch control φ2 being at L level, capacitor element 115 of first sampling section 110 holds charge of analog input A, and capacitor element 125 of third sampling section 120 holds charge according to the output result of quantizer 180. Further, capacitor element 165 of second feedback circuit 160 holds the integrated charge, switch control circuit 200 controls analog switches 141 to 144 so that the output result of quantizer 180 is charged to capacitor element 145 of fourth sampling section 140, and divider 210 transmits the output of quantizer 180 to digital filter 230 (operating state: f.).

Next, charge of capacitor element 115 of first sampling section 110 and charge of capacitor element 135 of third sampling section 130 are integrated to capacitor element 155 of first feedback circuit 150 according to analog switch control φ1 being at L level and analog switch control φ2 being at H level, and quantizer 180 converts the output of first and second integration sections 250 and 260 to a digital signal. Further, capacitor element 125 of second sampling section 120 is charged with the charge of analog input B, and capacitor element 145 of fourth sampling section 140 is charged with the charge according to the output result of quantizer 180 (operating state: g.).

Next, according to analog switch control φ1 being at L level and analog switch control φ2 being at L level, capacitor element 155 of first feedback circuit 140 holds the integrated charge, switch control circuit 200 controls analog switches 131 to 134 so that the output result of quantizer 180 is charged to capacitor element 135 of third sampling section 130, and divider 210 transmits the output of quantizer 180 to digital filter 220. Further, capacitor element 125 of second sampling section 120 holds the charge of analog input B, and capacitor element 145 of fourth sampling section 140 holds the charge according to the output result of quantizer 180 (operating state: h.).

Next, according to analog switch control φ1 being at H level and analog switch control φ2 being at L level, capacitor element 115 of first sampling section 110 is charged with the charge of analog input A, and capacitor element 135 of third sampling section 130 is charged with the charge according to the output result of quantizer 180. Further, the charge of capacitor element 125 of second sampling section 120 and the charge of capacitor element 145 of fourth sampling section 140 are integrated to capacitor element 165 of second feedback circuit 160, and quantizer 180 converts the output of first and second integration sections 250 and 260 to a digital signal (operating state: i).

When the above-described circuits reach a state of equilibrium, operating state: f. to operating state: m. are sequentially repeated.

Therefore, as the output of delta-sigma modulator 100, according to a change from a state where analog switch control φ1 is at L level and analog switch control φ2 is at H level to a state where analog switch control φ1 is at L level and analog switch control φ2 is at L level, the output corresponding to analog input A is transmitted to delta-sigma modulator output terminal 103. According to a change from a state where analog switch control φ1 is at H level and analog switch control φ2 is at L level to a state where analog switch control φ1 is at L level and analog switch control φ2 is at L level, the output corresponding to analog input B is transmitted.

As described above, according to this embodiment, delta-sigma modulator 100 has: first sampling section 110 that samples first analog input; second sampling section 120 that samples second analog input; third sampling section 130 that samples output of quantizer 180 corresponding to the first analog input; fourth sampling section 140 that samples output of quantizer 180 corresponding to the second analog input; and switch control circuit 200 that controls analog switches 111 to 114, 121 to 124, 131 to 134, 141 to 144, 151 and 161 so as to perform time division processing on integration of the output of first sampling section 110 and the output of third sampling section 130 and integration of the output of second sampling section 120 and the output of fourth sampling section 140. Switch control circuit 200 carries out control so as to alternately carry out operation of integrating the already sampled second analog input upon sampling of the first analog input, and integrating the already sampled first analog input upon sampling of the second analog input. Namely, control is performed so as to carry out processing alternately with respect to time for a sampling period and integration period for the first analog input and the second analog input, and the sampling period and integration period for the first analog input and the second analog input are processed alternately with respect to time, so that it is possible to make circuit operating speed high and double the oversampling ratio. As a result, it is possible to suppress increase in current consumption in the delta-sigma modulator which processes an input signal of two channels.

Further, delta-sigma modulator 100 of this embodiment is a delta-sigma modulator supporting two channels, and therefore particularly advantageous with respect to the point where increase in circuit dimension can be avoided compared to an A/D converter where one-channel delta-sigma modulators are provided in parallel.

Moreover, delta-sigma modulator 100 of this embodiment is a delta-sigma modulator supporting two channels, and therefore particularly applicable to a delta-sigma modulator and A/D converter of a signal processing system which normally carries out two-channel processing, for example, a two channel analog signal (Lch/Rch) processing apparatus and a wireless apparatus which performs signal processing by dividing the input signal into real part data (Ich) and imaginary part data (Qch).

The above description is an example of preferred embodiments of the present invention, and by no means limit the scope of the present invention. For example, the analog switch may be any kind of switch element if the switch element is an element carrying out switching operation.

Further, in this embodiment, an example of application to a first order delta-sigma modulator has been described, but application is also similarly possible to a second or higher order delta-sigma modulator. The effects become more substantial for a delta-sigma modulator of a higher order.

Further, in this embodiment, the equipments are referred to as a delta-sigma modulator and A/D modulator, but this is for ease of description and is by no means limiting.

Moreover, the type, number, and connection method of each circuit section configuring the above-described delta-sigma modulator, such as switch elements and quantizers are by no means limited to the above-described embodiment.

As described above, according to the present invention, a sampling period and integrating period for first analog input and second analog input are alternately processed with respect to time, so that it is possible to double the oversampling ratio compared to the related art, and the operation speed of the circuit needs not to be increased, so that it is possible to suppress current consumption. Further, effects become more substantial for a delta-sigma modulator of a higher order.

Therefore, the delta-sigma modulator and A/D converter according to the present invention are effective as a recording apparatus for analog signals (Lch/Rch) in the audio field. Further, the present invention can be applied to processing of real part data (Ich) and imaginary part data (Qch) of an A/D converter provided with a delta-sigma modulator used in a digital wireless telephone, and is also useful as an A/D converter for a wireless communication system such as mobile equipment. Moreover, the present invention can be broadly applied to an A/D converter for electronic equipments other than mobile equipment.

What is claimed is:

1. A delta-sigma modulator, comprising:
   a first sampling section that samples first analog input;
   a second sampling section that samples second analog input;
   a third sampling section that samples output of a quantizer corresponding to the first analog input;
   a fourth sampling section that samples output of the quantizer corresponding to the second analog input;
   a first integration section that integrates the output of the first sampling section and the output of the third sampling section;
   a second integrating section that integrates the output of the second sampling section and the output of the fourth sampling section; and
   a control section that carries out time division processing on integration of an output of the first sampling section and an output of the third sampling section and integration of an output of the second sampling section and integration of an output of the fourth sampling section.

2. A delta-sigma modulator, comprising:
   a first sampling section that samples first analog input;
   a second sampling section that samples second analog input;
   a third sampling section that samples output of a quantizer corresponding to the first analog input;
   a fourth sampling section that samples output of the quantizer corresponding to the second analog input; and
   a control section that carries out time division processing on integration of an output of the first sampling section and an output of the third sampling section and integration of an output of the second sampling section and integration of an output of the fourth sampling section, wherein the control section integrates the output of the second sampling section and the output of the fourth sampling section upon sampling of the first analog input and sampling of the output of the quantizer corresponding to the first analog input and integrates the output of the first sampling section and the output of the third sampling section upon sampling of the second analog input and sampling of the output of the quantizer corresponding to the second analog input.

3. A delta-sigma modulator, comprising:
a first sampling section that samples first analog input;
a second sampling section that samples second analog input;
a third sampling section that samples output of a quantizer corresponding to the first analog input;
a fourth sampling section that samples output of the quantizer corresponding to the second analog input; and
a control section that carries out time division processing on integration of an output of the first sampling section and an output of the third sampling section and integration of an output of the second sampling section and integration of an output of the fourth sampling section, wherein the control section integrates the already sampled second analog input and the output of the quantizer corresponding to the already sampled second analog input upon sampling of the first analog input and sampling of the output of the quantizer corresponding to the first analog input and integrates the already sampled first analog input and the output of the quantizer corresponding to the already sampled first analog input upon sampling of the second analog input and sampling of the output of the quantizer corresponding to the second analog input.

4. The delta-sigma modulator according to claim 1, wherein the control section carries out control so as to process a sampling period and an integration period for the first analog input and the second analog input, alternately with respect to time.

5. The delta-sigma modulator according to claim 1, wherein the control section carries out control to operate so as to integrate the already sampled second analog input upon sampling of the first analog input, and integrate the already sampled first analog input upon sampling of the second analog input.

6. The delta-sigma modulator according to claim 1, wherein the quantizer is an N-bit (where N is an arbitrary natural number of 1 or more) A/D converter.

7. The delta-sigma modulator according to claim 1, wherein the third and fourth sampling sections are N-bit D/A converters.

8. An A/D converter comprising:
the delta-sigma modulator according to claim 1;
a divider that divides output of the delta-sigma modulator so as to correspond to the input; and
a digital filter that decimates the divided output of the delta-sigma modulator.

9. The delta-sigma modulator according to claim 1, wherein the control section integrates the output of the second sampling section and the output of the fourth sampling section upon sampling of the first analog input and sampling of the output of the quantizer corresponding to the first analog input and integrates the output of the first sampling section and the output of the third sampling section upon sampling of the second analog input and sampling of the output of the quantizer corresponding to the second analog input.

10. The delta-sigma modulator according to claim 1, wherein the control section integrates the already sampled second analog input and the output of the quantizer corresponding to the already sampled second analog input upon sampling of the first analog input and sampling of the output of the quantizer corresponding to the first analog input and integrates the already sampled first analog input and the output of the quantizer corresponding to the already sampled first analog input upon sampling of the second analog input and sampling of the output of the quantizer corresponding to the second analog input.

* * * * *